United States Patent
Hsieh et al.

(10) Patent No.: US 12,427,558 B2
(45) Date of Patent: Sep. 30, 2025

(54) SEMICONDUCTOR CHEMICAL MECHANICAL POLISHING SLUDGE RECYCLING METHOD

(71) Applicant: Transcene Corporation, Tainan (TW)

(72) Inventors: Ya-Min Hsieh, Tainan (TW); Hsin-Hui Chou, Tainan (TW); Hsing-Wen Hsieh, Tainan (TW); Shao-Hua Hu, Tainan (TW); Wen-Ming Cheng, Tainan (TW); Chin-An Kuan, Tainan (TW)

(73) Assignee: Transcene Corporation, Tainan (TW)

( * ) Notice: Subject to any disclaimer, the term of this patent is extended or adjusted under 35 U.S.C. 154(b) by 371 days.

(21) Appl. No.: 18/188,492

(22) Filed: Mar. 23, 2023

(65) Prior Publication Data
US 2024/0316608 A1 Sep. 26, 2024

(51) Int. Cl.
*C02F 9/00* (2023.01)
*B09B 3/40* (2022.01)
*B09B 3/80* (2022.01)
*C09G 1/02* (2006.01)
*H01L 21/306* (2006.01)
*C02F 1/00* (2023.01)
(Continued)

(52) U.S. Cl.
CPC .............. *B09B 3/40* (2022.01); *B09B 3/80* (2022.01); *C09G 1/02* (2013.01); *H01L 21/30625* (2013.01); *C02F 1/001* (2013.01); *C02F 1/46* (2013.01); *C02F 2103/346* (2013.01)

(58) Field of Classification Search
CPC ........ C02F 9/00; C02F 11/127; C02F 11/143; C02F 11/18; C02F 2101/30; C02F 2103/346; C02F 11/13; C02F 11/12; C02F 11/121; C02F 11/14; C02F 11/148; C01B 33/12; B09B 3/40; B09B 3/80; C09G 1/02; H01L 21/30625
See application file for complete search history.

(56) References Cited

U.S. PATENT DOCUMENTS

2004/0071619 A1* 4/2004 Myerson ............. C01G 9/02
423/109
2004/0245184 A1* 12/2004 Umezawa ............ C02F 1/004
210/243

FOREIGN PATENT DOCUMENTS

CN 112919477 A * 6/2021 ............. C01B 33/12

OTHER PUBLICATIONS

English language machine translation of CN-112919477-A, 8 pages, No Date.*

* cited by examiner

*Primary Examiner* — Pranav N Patel

(57) ABSTRACT

The present invention relates to a semiconductor chemical mechanical polishing sludge recycling method, which comprises the following steps: (1) drying out the CMP sludge into a condition of solid; (2) putting the solid sludge obtained in step (1) into a high-temperature furnace for roasting; (3) putting the solid sludge obtained in step (2) into a reaction tank and adding a impregnating liquid for soaking, (4) performing a solid-liquid separation in step (3) to obtain a solid and a liquid, (5) performing a concentration reaction on the liquid separated in step (4) to obtain a copper sulfate aqueous solution by-product; (6) taking out the solid sludge obtained in step (4) and adding water for washing; (7) dehydrating a product obtained in step (6); (8) obtaining the solid dehydrated is the goods, and a sum of silicon dioxide and aluminum oxide on a dry basis is greater than 94%.

4 Claims, 5 Drawing Sheets

| Item (dry basis) | Ratio |
|---|---|
| combustible | 15% ~ 25% |
| silicon dioxide | 30% ~ 80% |
| aluminum oxide | 5% ~ 40% |
| cerium oxide | <5% |
| copper oxide (soluble oxide) | <5% |

(51) Int. Cl.
*C02F 1/46* (2023.01)
*C02F 103/34* (2006.01)

| Item (dry basis) | Ratio |
|---|---|
| combustible | 15% ~ 25% |
| silicon dioxide | 30% ~ 80% |
| aluminum oxide | 5% ~ 40% |
| cerium oxide | <5% |
| copper oxide (soluble oxide) | <5% |

FIG.1

| | Embodiment 1 | Embodiment 2 | Embodiment 3 |
|---|---|---|---|
| Water content | 45.1% | 60.6% | 50.4% |
| Item (dry basis) | | | |
| combustible | 16.5% | 21.4% | 14.9% |
| silicon dioxide | 61.1% | 49.3% | 73.3% |
| aluminum oxide | 18.3% | 22.2% | 6.2% |
| cerium oxide | 3.0% | 4.2% | 3.1% |
| copper oxide (soluble oxide) | 1.1% | 2.9% | 2.5% |

FIG.3

| Item (dry basis) | Embodiment 1 | Embodiment 2 | Embodiment 3 |
|---|---|---|---|
| Water content | 40.1% | 3.3% | 3.2% |
| silicon dioxide | 74.2% | 65.2% | 88.7% |
| aluminum oxide | 22.2% | 29.3% | 7.5% |
| cerium oxide | 3.6% | 5.5% | 3.8% |

FIG.4

| | Embodiment 1 | Embodiment 2 | Embodiment 3 |
|---|---|---|---|
| Copper sulfate concentration | 23.5% | 23.9% | 2.50% |

FIG.5

SEMICONDUCTOR CHEMICAL MECHANICAL POLISHING SLUDGE RECYCLING METHOD

BACKGROUND OF THE PRESENT INVENTION

Field of Invention

The present invention relates to a semiconductor chemical mechanical polishing sludge recycling method.

Description of Related Arts

It is noted that a very important step in the silicon wafer production process is the chemical mechanical polishing (CMP) process. The sludge produced by semiconductor chemical mechanical polishing (referred to as CMP sludge) is the main solid waste of the wafer foundry, which comes from the chemical mechanical polishing process in the process of the wafer foundry. The sludge components are mainly high-hardness mineral ceramic materials such as silicon dioxide, aluminum oxide, and cerium oxide, which are mainly abrasive debris components of silicon dioxide particles. At present, the CMP sludge is recognized as general industrial waste, leaving the factory in the form of waste code D0902 inorganic sludge, and entrusted with legal removal for burial, incineration or other treatment. However, the resources of such treatment methods cannot be reused, which is extremely wasteful of resources, and has no environmental protection benefits.

SUMMARY OF THE PRESENT INVENTION

The main purpose of the present invention is to provide a semiconductor chemical mechanical polishing sludge recycling method, which can effectively solve the drawbacks of semiconductor chemical mechanical polishing sludge treatment methods.

According to the semiconductor chemical mechanical polishing sludge recycling method of the present invention, a semiconductor CMP sludge is an inorganic sludge with a water content of 30% to 80%, wherein the sludge recycling method includes the following steps:

(1) drying: drying out the CMP sludge into a condition of solid, wherein the drying temperature is 100° C.~200° C., and the drying time is 0.5~2 hours;

(2) roasting: putting the solid sludge obtained in step (1) into a high-temperature furnace for roasting, wherein the roasting temperature is 800° C.~1200° C., and the roasting time is 0.5~3 hours;

(3) soaking: putting the solid sludge obtained after roasting in step (2) into a reaction tank and adding a impregnating liquid for stirring, wherein the stirring temperature is 20° C.~80° C., the stirring time is 0.5~2 hours, wherein the impregnating liquid is implemented as a single ingredient solution of inorganic acid or organic acid, or as a mixed solution composed of inorganic acid, organic acid and deionized water, wherein the inorganic acid is implemented as hydrochloric acid, nitric acid, sulfuric acid, phosphoric acid, etc., and the organic acid is implemented as carboxyl acid (—COOH), sulfonic acid (R—SO3H), sulfinic acid (R—SOOH), and thiocarboxylic acid (R—SH) etc., wherein the equivalent concentration of inorganic acid and organic acid in the impregnating liquid is less than 5N respectively, wherein the weight ratio of liquid to solid of the impregnating liquid and the solid sludge is 1:1~10:1;

(4) separating: performing a solid-liquid separation to a reaction product in step (3) to obtain a solid and a liquid, wherein the separation method is allowed to be one of heat drying, freeze drying, filtration, centrifugation, sedimentation, etc., or a combination thereof;

(5) concentrating: performing a concentration reaction on the liquid separated in step (4) through a concentration system to obtain a copper sulfate aqueous solution by-product, and recycling the residual liquid in the concentration system into a regenerative concentrated solution system;

(6) cleaning: taking out the solid sludge obtained by the separation treatment in step (4) and adding water for washing, wherein the turbidity of water is less than 150 NTU, the weight ratio of the water to the solid sludge is 1:1~10:1, and the washing time is 0.5~2 hours, wherein recycling the residual water after cleaning into a recycled water system;

(7) dehydrating: dehydrating a product obtained in step (6) to obtain solid and liquid, wherein the dehydration method is allowed to be one of heat drying, freeze drying, filtration, centrifugation, etc., or a combination thereof; and (8) obtaining a goods: obtaining the solid dehydrated in the step (7) is the goods, wherein a sum of silicon dioxide and aluminum oxide on a dry basis is greater than 94%.

The advantages provided by the semiconductor chemical mechanical polishing sludge recycling method of the present invention, include the following: the goods obtained from CMP sludge recycling can be used as refractory materials, industrial filling materials, ceramic materials, etc., so that resources can be fully reused and have great environmental protection benefits.

BRIEF DESCRIPTION OF THE DRAWINGS

FIG. 1 is a composition table of the CMP polishing sludge of the present invention.

FIG. 3 is a composition table of the CMP polishing sludge of an embodiment.

FIG. 4 is a goods composition table of the above-mentioned embodiment.

FIG. 5 is a goods composition table of the copper sulfate solution of the above-mentioned embodiment.

DETAILED DESCRIPTION OF THE PREFERRED EMBODIMENT

Figure 2:
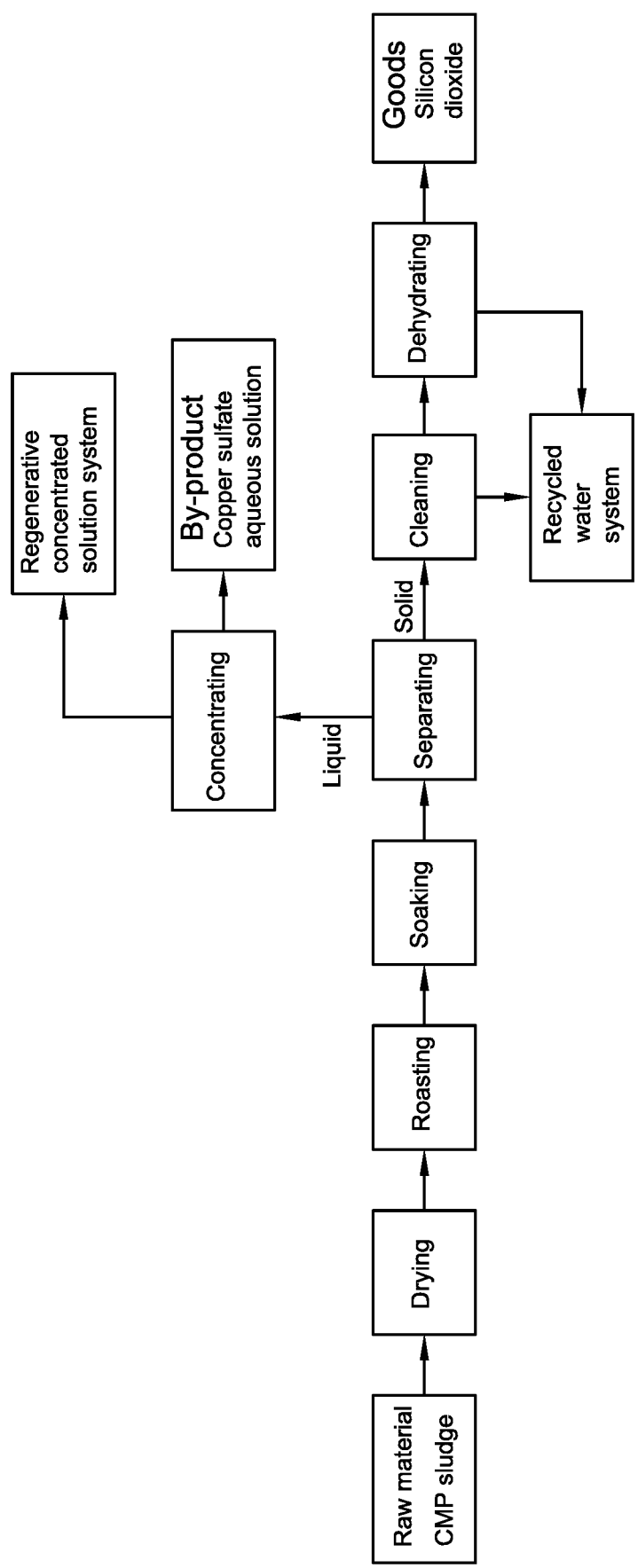
FIG. 2 is a flow diagram of the resource processing of the present invention.

In order to achieve the above-mentioned objects and effects of the present invention, the technical means adopted are hereby enumerated through a preferred feasible embodiment, and illustrated in the drawings, detailed as follows:

According to the semiconductor chemical mechanical polishing sludge recycling method of the present invention, wherein the moisture content of semiconductor CMP sludge reaches 30%~80%. FIG. 1 illustrates the dry basis composition of the present invention, and FIG. 2 illustrates the process flow of the recycling method of the present invention, wherein the processing steps include the following:

(1) drying: drying out the CMP sludge into a condition of solid, wherein the drying temperature is 100° C.~200° C., and the drying time is 0.5~2 hours;

(2) roasting: putting the solid sludge obtained in step (1) into a high-temperature furnace for roasting, wherein the roasting temperature is 800° C.~1200° C., and the roasting time is 0.5~3 hours;

(3) soaking: putting the solid sludge obtained in step (2) into a reaction tank and adding a impregnating liquid for stirring, wherein the stirring temperature is 20° C.~80° C., the stirring time is 0.5~2 hours, wherein the impregnating liquid is implemented as a single ingredient solution of inorganic acid or organic acid, or as a mixed solution composed of inorganic acid, organic acid and deionized water, wherein the inorganic acid is implemented as hydrochloric acid, nitric acid, sulfuric acid, phosphoric acid, etc., and the organic acid is implemented as carboxyl acid (—COOH), sulfonic acid (R—SO3H), sulfinic acid (R—SOOH), and thiocarboxylic acid (R—SH), etc., wherein the equivalent concentration of inorganic acid and organic acid in the impregnating liquid is less than 5N respectively, wherein the weight ratio of liquid to solid of the impregnating liquid and the solid sludge is 1:1~10:1;

(4) separating: performing a solid-liquid separation to a reaction product in step (3) to obtain a solid and a liquid, wherein the separation method is allowed to be one of heat drying, freeze drying, filtration, centrifugation, sedimentation, etc., or a combination thereof;

(5) concentrating: performing a concentration reaction on the liquid separated in step (4) through a concentration system to obtain a copper sulfate aqueous solution by-product, wherein the concentration method is allowed to be one of extraction, thermal evaporation, freezing concentration, crystallization, electrolysis, filtration, etc., or a combination thereof, wherein recycling the residual liquid in the concentration system into a regenerative concentrated solution system;

(6) cleaning: taking out the solid sludge obtained by the separation treatment in step (4) and adding water for washing, wherein the turbidity of water is less than 150 NTU, the weight ratio of the water to the solid sludge is 1:1~10:1, and the washing time is 0.5~2 hours, wherein recycling the residual water after cleaning into a recycled water system;

(7) dehydrating: dehydrating a product obtained after cleaning in step (6) to obtain solid and liquid, wherein the dehydration method is allowed to be one of heat drying, freeze drying, filtration, centrifugation, etc., or a combination thereof, wherein recycling the dehydrated liquid into the recycled water system; and (8) obtaining a goods: obtaining the solid dehydrated in the step (7) is a silicon dioxide goods, wherein a sum of silicon dioxide and aluminum oxide on a dry basis is greater than 94%.

The first embodiment of the present invention (referring to FIG. 3, 4, 5):

(1) drying out 2000 Kg of CMP sludge into a condition of solid, wherein the drying temperature is 200° C., and the drying time is 0.5 hours;

(2) putting 1000 Kg of the solid obtained in step (1) into a high-temperature furnace for roasting, wherein the roasting temperature is 800° C., and the roasting time is 3 hours;

(3) putting 1000 Kg of the solid obtained in step (2) into a reaction tank and adding impregnating liquid for stirring, wherein the stirring temperature is 60° C. and the stirring time is 0.5 hours, wherein the impregnating liquid is a mixture liquid of 3000 Kg of 3N oxalic acid and 3000 Kg of 3N sulfuric acid, wherein the mixture liquid is 6000 Kg, so that the weight ratio of liquid to solid of the impregnating liquid and the solid sludge is 6:1;

(4) taking 1000 Kg of the reaction product in step (3) and performing plate and frame filtration to obtain a solid and a liquid, wherein the filtration time is 2 hours;

(5) putting the filtered liquid obtained in step (4) into an extraction system for extraction, and then stripping the liquid with sulfuric acid to obtain a copper sulfate aqueous solution by-product;

(6) taking out 1000 Kg of the filtered solid obtained in step (4), adding 1000 Kg of the deionized water for washing, so the weight ratio of the deionized water to the solid is 1:1, wherein the washing time is 2 hours;

(7) performing centrifugation to the product 1000 Kg after step (6) cleaning, wherein the centrifugal force is 4000 (G), and the centrifugal time is 0.5 hours; and (8) obtaining the solid centrifuged in step (7) is a silicon dioxide goods with a water content of 35%~45%, wherein the sum of silicon dioxide and aluminum oxide on a dry basis is 96.4%.

The second embodiment of the present invention (referring to FIG. 3, 4, 5):

(1) drying out 2000 Kg of CMP sludge into a condition of solid, wherein the drying temperature is 150° C., and the drying time is 1.5 hours;

(2) putting 1000 Kg of the solid obtained in step (1) into a high-temperature furnace for roasting, wherein the roasting temperature is 900° C., and the roasting time is 2 hours;

(3) putting 1000 Kg of the solid obtained in step (2) into a reaction tank and adding impregnating liquid for stirring, wherein the stirring temperature is 40° C. and the stirring time is 1.5 hours, wherein the impregnation liquid is 3000 Kg of nitric acid, and the equivalent concentration of nitric acid is 5N, so that the weight ratio of liquid to solid of the impregnating liquid and the solid sludge is 3:1;

(4) taking 1000 Kg of the reaction product in step (3) and performing centrifugation to obtain a solid and a liquid, wherein the centrifugal force is 4000 (G), and the centrifugation time is 0.5 hours;

(5) taking 1000 Kg of the centrifuged liquid obtained in step (4) and performing thermal evaporation and concentration to obtain a copper sulfate aqueous solution by-product, wherein thermal evaporation temperature is 150° C. and the time is 0.2 hours.

(6) taking out 1000 Kg of the centrifuged solid obtained in step (4) and adding 4000 Kg of the deionized water for washing, so that the weight ratio of the deionized water to the solid is 4:1, wherein the washing time is 0.5 hours;

(7) drying 1000 Kg of the product cleaned in step (6), wherein the drying temperature is 120° C., and the drying time is 1.5 hours; and (8) obtaining the dried solid in step (7), is a silicon dioxide goods with a moisture content less than 5%, and the sum of silicon dioxide and aluminum oxide on a dry basis is 94.5%.

The third embodiment of the present invention (referring to FIG. 3, 4, 5):

(1) drying out 2000 Kg of CMP sludge into a condition of solid, wherein the drying temperature is 150° C., and the drying time is 1.5 hours;

(2) putting 1000 Kg of the solid obtained in step (1) into a high-temperature furnace for roasting, wherein the roasting temperature is 900° C., and the roasting time is 2 hours;

(3) putting 1000 Kg of the solid obtained in step (2) into a reaction tank and adding impregnating liquid for stirring, wherein the stirring temperature is 40° C. and the stirring time is 1.5 hours, wherein the impregnating liquid is a mixed solution of 5000 Kg citric acid and 3000 Kg acetic acid, the equivalent concentration of citric acid and acetic acid is 5N respectively, so that the weight ratio of liquid to solid of the impregnating liquid and the sludge solid is 8:1;

(4) performing freeze-drying on 1000 Kg of the reaction product in step (3) to obtain a solid and a liquid, wherein the freeze-drying temperature is −40° C., and the freeze-drying time is 1.5 hours;

(5) putting the liquid obtained by freeze-drying in step (4) into a freeze-concentration system to obtain a copper sulfate aqueous solution by-product, wherein the temperature is set at −40° C. and the time is 0.7 hours;

(6) taking out 1000 Kg of the solid obtained by freeze-drying in step (4), adding 1000 Kg of the deionized water for washing, wherein the weight ratio of the deionized water to the solid is 1:1, and the washing time is 2 hours;

(7) performing freeze-drying on 1000 Kg of the solid filtered in step (6), wherein the temperature is set at −40° C., and the time is 1.5 hours; and (8) obtaining the dried solid in step (7), is a silicon dioxide goods with a moisture content less than 5%, and the sum of silicon dioxide and aluminum oxide on a dry basis is 96.2%.

In summary, the present invention has indeed achieved the expected objects and effects, and is more ideal and practical than those in the art. The above-mentioned embodiment is only specific descriptions for the preferred embodiments of the present invention, the embodiment is not intended to limit the scope of the patent application of the present invention, and all other equivalent changes and modifications accomplished without departing from the technical means disclosed in the present invention shall be covered by the present application.

What is claimed is:

1. A semiconductor chemical mechanical polishing sludge recycling method, wherein a semiconductor CMP sludge is sludge with a water content of 30% to 80%, wherein the sludge recycling method comprises the following steps:

(1) drying: drying out the CMP sludge to obtain a solid sludge, wherein a drying temperature is 100° C.~200° C., and a drying time is 0.5~2 hours;

(2) roasting: putting the solid sludge obtained in step (1) into a high-temperature furnace for roasting, wherein a roasting temperature is 800° C.~1200° C., and a roasting time is 0.5~3 hours;

(3) soaking: putting the solid sludge obtained in step (2) into a reaction tank and adding a impregnating liquid for stirring, wherein a stirring temperature is 20° C.~80° C., a stirring time is 0.5~2 hours, wherein the impregnating liquid is implemented as a single ingredient solution of inorganic acid or organic acid, or as a mixed solution composed of inorganic acid, organic acid and deionized water, wherein the inorganic acid is selected from the group consisting of hydrochloric acid, nitric acid, sulfuric acid, and phosphoric acid, and the organic acid is selected from the group consisting of carboxyl acid (—COOH), sulfonic acid (R—SO3H), sulfinic acid (R—SOOH), and thiocarboxylic acid (R—SH), wherein an equivalent concentration of inorganic acid and organic acid in the impregnating liquid is less than 5N respectively, wherein a weight ratio of liquid to solid of the impregnating liquid and the solid sludge is 1:1~10:1;

(4) separating: performing a solid-liquid separation to a reaction product in step (3) to obtain a solid and a liquid;

(5) concentrating: performing a concentration reaction on the liquid separated in step (4) through a concentration system to obtain a copper sulfate aqueous solution by-product, and recycling a residual liquid in a concentration system into a regenerative concentrated solution system;

(6) cleaning: taking out the solid sludge obtained by the separation treatment in step (4) and adding water for washing, wherein a turbidity of water is less than 150 NTU, a weight ratio of the water to the solid sludge is 1:1~10:1, and a washing time is 0.5~2 hours, wherein recycling a residual water after cleaning into a recycled water system;

(7) dehydrating: dehydrating a product obtained in step (6) to obtain solid and liquid, wherein recycling a dehydrated liquid into the recycled water system; and (8) obtaining a goods: obtaining a solid dehydrated in the step (7) is a silicon dioxide goods, wherein a sum of silicon dioxide and aluminum oxide on a dry basis is greater than 94%.

2. The semiconductor chemical mechanical polishing sludge recycling method, as recited in claim 1, wherein the separating in step (4) is selected from the group consisting of heat drying, freeze drying, filtration, centrifugation, and sedimentation.

3. The semiconductor chemical mechanical polishing sludge recycling method, as recited in claim 1, wherein the concentrating in step (5) is selected from the group consisting of extraction, thermal evaporation, freezing concentration, crystallization, electrolysis, and filtration.

4. The semiconductor chemical mechanical polishing sludge recycling method, as recited in claim 1, wherein the dehydrating in step (7) is selected from the group consisting of heat drying, freeze drying, filtration, and centrifugation.

* * * * *